(12) United States Patent
Zheng

(10) Patent No.: US 11,677,386 B2
(45) Date of Patent: Jun. 13, 2023

(54) SYSTEM, DEVICE, AND METHODS FOR AN ADAPTIVE FREQUENCY ADJUSTMENT CIRCUIT

(71) Applicant: Rockchip Electronics Co., Ltd., Fuzhou (CN)

(72) Inventor: Fayao Zheng, Fuzhou (CN)

(73) Assignee: Rockchip Electronics Co., Ltd., Fujian (CN)

( * ) Notice: Subject to any disclaimer, the term of this patent is extended or adjusted under 35 U.S.C. 154(b) by 0 days.

(21) Appl. No.: 17/694,699

(22) Filed: Mar. 15, 2022

(65) Prior Publication Data

US 2022/0294431 A1 Sep. 15, 2022

(30) Foreign Application Priority Data

Mar. 15, 2021 (CN) .......................... 202110277318.4

(51) Int. Cl.
*H03K 3/03* (2006.01)
*H03L 7/06* (2006.01)
*H03B 5/04* (2006.01)

(52) U.S. Cl.
CPC ............ *H03K 3/0315* (2013.01); *H03B 5/04* (2013.01); *H03L 7/06* (2013.01); *H03B 2200/003* (2013.01); *H03B 2201/02* (2013.01)

(58) Field of Classification Search
CPC .................................................... H03K 3/0315
USPC ............................................................ 331/57
See application file for complete search history.

(56) References Cited

U.S. PATENT DOCUMENTS

2008/0048793 A1* 2/2008 Koerner ............... H03B 5/1228
331/109
2014/0266472 A1* 9/2014 Waldrip ................. H03L 7/087
331/44

* cited by examiner

*Primary Examiner* — Joseph Chang

(57) ABSTRACT

The present disclosure provides an adaptive adjustment circuit in a computer chip having a voltage-controlled oscillator (VCO) and a processor. The adaptive adjustment circuit comprises a frequency difference acquisition module to generate a frequency difference signal based on a first difference between an oscillation frequency of the VCO and a target frequency. The adaptive adjustment circuit also includes a power module to supply a working voltage to the VCO and the processor, adjust the working voltage based on the frequency difference signal, and supply the adjusted working voltage to the VCO and the processor.

9 Claims, 3 Drawing Sheets

SYSTEM, DEVICE, AND METHODS FOR AN ADAPTIVE FREQUENCY ADJUSTMENT CIRCUIT

CROSS REFERENCE TO RELATED APPLICATION

The present application is a US non-provisional application claiming the benefit of priority to a Chinese Patent Application No. CN 2021102773184 filed with CNIPA on Mar. 15, 2021, the disclosure of the above application is incorporated herein by reference in its entirety for all purposes.

TECHNICAL FIELD

The present disclosure relates to the field of automatic frequency control and frequency adjustment circuit, and more particular to an adaptive frequency adjustment circuit.

BACKGROUND

With the improvement of integrated circuit performance and technology, circuit power consumption and process fluctuation have posed an increasing impact on chip yield, performance consistency, and product stability.

In terms of manufacturing process, differences may exist among different chips during fabrication. Therefore, even under the same operating voltage, there may be differences in the frequency at which different chips can work stably. Conventionally, for each chip, the operating voltage corresponding to each operating frequency point is often obtained based on a measured "frequency-voltage" table. However, the "frequency-voltage" table needs to be obtained by performing stability testing on a large number of chips. During the testing process, it is necessary to perform a long-term stability test on the operating voltage corresponding to each operating frequency of the chip, and the workload is often large.

In terms of circuit power consumption, the performance of a chip may be affected by factors such as operating voltage and manufacturing process, so there may be differences in performance between different chips in practical applications. For the same operating frequency, a chip with poor performance may need a higher operating voltage, while a chip with better performance may need a relatively low operating voltage. After performing a stability test on the chip to obtain the "frequency-voltage" table, in order to ensure that all chips can work normally, conventional approach needs to configure the operating voltage corresponding to each operating frequency point for the chip with poor performance. However, the working voltage configured in this way is higher than the actual working voltage required by the chip with better performance. Therefore, when the chip with better performance sets its working voltage according to the "frequency-voltage" table, it may cause unnecessary problems, such as increased power consumption.

In addition, when used for power supply, the output voltage of a power supply chip often has deviations. In practical applications, it is necessary to consider the voltage error of the output of the power supply chip, and increase the voltage value in the "frequency-voltage" table by a corresponding proportion. Specifically, in order to ensure that all chips can work normally, conventional approach needs to configure the operating voltage corresponding to each operating frequency point according to the output voltage of the power chip with negative deviation. However, when the operating voltage is configured in this way, the power chip has a positive deviation, and will bring unnecessary increase in power consumption.

Moreover, for existing power chips, their transient response performance is often difficult to meet the requirements of high-performance chips. Specifically, when the chip load suddenly increases, it is often difficult for the power chip to respond in time. In practical applications, there will generally be a few microseconds to tens of microseconds difference. The filter capacitor on the power supply needs to provide energy for the chip. At this time, the power chip needs to meet the continuous and stable operation of the chip, and conventional approach needs to ensure that the power chip can still meet the power supply demand after the voltage drops. The lowest voltage point in the segment is considered to further increase the operating voltage corresponding to each operating frequency point, which will lead to a further increase in power consumption.

To sum up, the conventional technology cannot adaptively adjust the operating frequency of the chip according to the operating voltage, manufacturing process, and other factors associated with the chip, and therefore can only obtain the corresponding operating frequencies of different chips at each operating frequency based on the measured "frequency-voltage" table. On the one hand, the acquisition of the "frequency-voltage" table relies on a large number of stability tests, and the workload is large. On the other hand, in order to ensure that most chips can meet the performance requirements, the operating voltage configured based on the "frequency-voltage" table is often higher than the actual requirements of the chip, resulting in unnecessary power consumption.

SUMMARY OF THE DISCLOSURE

The present disclosure provides system, device, chip, and methods that are configured to perform adaptive frequency adjustment, and may provide the following beneficial effects.

The adaptive frequency adjustment circuit can adaptively adjust the working frequency and the working voltage of the chip according to the quality of the chip, such as configuring a higher working voltage for the chip with poor quality to meet its performance requirements, and configuring a lower operating voltage for the chip with better quality, in order to reduce power consumption while meeting the chip's performance needs.

In addition, when the working voltage of the chip changes, the adaptive frequency adjustment circuit can adaptively adjust the working frequency and the working voltage of the chip, so as to ensure the performance of the chip, and in the meantime reduce unnecessary power consumption as much as possible.

Furthermore, the self-adaptive frequency adjustment circuit of the present disclosure does not need a "frequency-voltage" table to obtain the operating voltage corresponding to each operating frequency of the chip, thus eliminating the need for a large number of stability tests, which is beneficial for reducing workload.

COMPONENT LABEL DESCRIPTION

Figure 1:
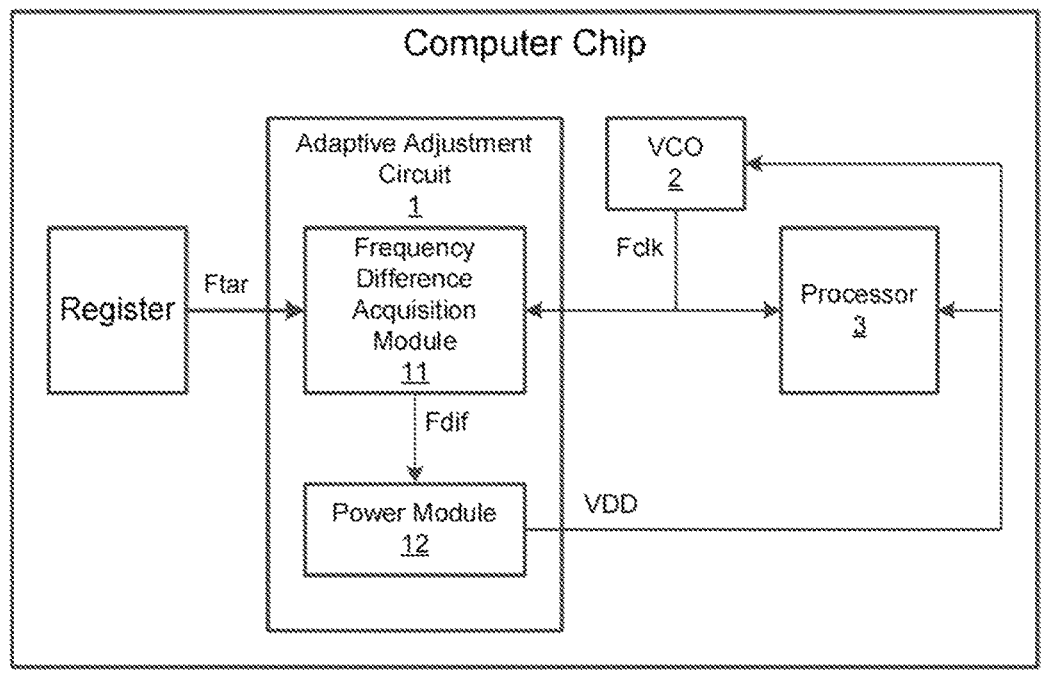
FIG. 1 illustrates an adaptive adjustment circuit configured in a computer chip, according to one or more embodiments of the present disclosure.

1 Adaptive frequency adjustment circuit
11 Frequency difference acquisition module
111 Oscillator
112 Frequency counter
113 Comparator
12 Power supply
13 Pre-configuration module
131 Pre-configuration unit
132 Cascade-reduce unit
133 Cascade-increase unit
14 Low pass filter
2 VCO
3 Processor

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

In practical applications, the performance of a chip may be affected by multiple factors such as manufacturing quality fluctuations and operating voltage, and the conventional technology cannot provide adaptive and dynamic adjustment of the operating frequency of the chip according to these related factors. A "frequency-voltage" table to store the corresponding relationship between the operating frequencies and operating voltages of the chip may be used. However, this method has the following disadvantages: on the one hand, the "frequency-voltage" table needs to be constructed by performing stability tests on a large number of chips, and the workload may be large. On the other hand, factors such as manufacturing process, operating voltage, and temperature may affect the chips, which may impact each one of the chips and result in performance differences between these chips.

Further, the "frequency-voltage" table cannot reflect the performance differences between different chips. The operating voltage corresponding to each operating frequency point in the table is often higher than the operating voltage actually required by most chips. Therefore, configuring the operating voltage of the chip according to the "frequency-voltage" table will lead to increased and unnecessary power consumption.

The present disclosure provides an adaptive adjustment circuit which can adaptively adjust the operating frequency and operating voltage of the chip according to the quality of the chip, so as to configure a higher operating voltage for the chip with low quality to meet its performance requirements. For chips with high quality, the adaptive adjustment circuit may configure a lower operating voltage to reduce power consumption while meeting their performance needs. In addition, when the working voltage of the chip changes, the adaptive adjustment circuit can adaptively adjust the working frequency and the working voltage of the chip, so as to ensure the performance of the chip and reduce unnecessary power consumption as much as possible. Furthermore, the self-adaptive adjustment circuit of the present disclosure does not need a "frequency-voltage" table to obtain the operating voltage corresponding to the chip at each operating frequency, so it does not need to perform a large number of stability tests, which is beneficial in reducing the workload.

FIG. 1 illustrates an adaptive adjustment circuit configured in a computer chip, according to one or more embodiments of the present disclosure. In FIG. 1, the chip may include, among other components, an adaptive adjustment circuit 1, a voltage-controlled oscillator 2, and a processor 3. The processor 3 may be a graphic processing unit (GPU), a digital signal processor (DSP), a central processing unit (CPU), or any core or hardware module that can perform specific computational functionalities.

In some embodiments, the voltage-controlled oscillator (or VCO) 2 may be configured to provide timing for the chip, and the oscillation frequency of the VCO 2, as well as the operating frequency of the processor 3, may be substantially the same as the operating frequency of the chip. Specifically, the oscillation frequency of the clock signal Fclk may be determined by the operating voltage of the VCO 2. Preferably, the oscillation frequency of the clock signal Fclk may be proportional to the operating voltage of the VCO 2.

In some embodiments, the adaptive adjustment circuit 1 may be configured with a frequency difference acquisition module 11 and a power module 12. The frequency difference obtaining module 11 may be connected to the VCO 2, and may be configured for obtaining a difference between the oscillation frequency of the VCO 2 and a target frequency Ftar, and generating a frequency difference signal Fdif based on the above difference. The target frequency may be pre-specified by software according to an actual application scenario and stored in a register in the chip.

In some embodiments, the value in the frequency difference signal Fdif may be used to identify the difference between the oscillation frequency of the VCO 2 and the target frequency Ftar. For example, when a difference between the oscillation frequency of the VCO 2 and the target frequency Ftar is positive, the frequency difference signal Fdif may be at a high level; and when a difference between the oscillation frequency of the VCO 2 and the target frequency Ftar is negative, the frequency difference signal Fdif may be at a low level.

In some embodiments, the power module 12 may be connected to the frequency difference obtaining module 11, the VCO 2, and the processor 3 The output voltage VDD of the power module 12 may be the operating voltage of the VCO 2 and the processor 3. Since both the VCO 2 and the processor 3 are powered by the power module 12, the working voltage of the chip and the working voltage of the VCO 2 may be deemed as approximately the same as the operating voltage of the processor 3.

In some embodiments, the power module 12 can also adjust its output voltage VDD according to the frequency difference signal Fdif, so that the difference between the oscillation frequency of the VCO 2 and the target frequency Ftar is within a frequency difference range. In this case, the oscillation frequency of the VCO 2 may be deemed approximately the same as the target frequency Ftar.

It should be noted that, since both the VCO 2 and the processor 3 are powered by the power module 12, when the power module 12 adjusts the operating voltage of the VCO 2, the operating voltage of the processor 3 is also adjusted at the same time. In a specific application, the target frequency and the frequency difference range can be configured according to actual requirements, so that when the difference between the oscillation frequency of the VCO 2 and the target frequency Ftar is within the frequency difference range, the operating voltage of the processor 3 is the actually required operating voltage.

In some embodiments, when a difference between the oscillation frequency of the VCO 2 and the target frequency Ftar is less than the lower limit of the frequency difference range, the power module 12 may reduce the operation of the VCO 2 voltage, thereby reducing the oscillation frequency of the VCO 2. When the difference between the oscillation frequency of the VCO 2 and the target frequency Ftar is greater than the upper limit of the frequency difference range, the power module 12 may increase the operating voltage of the VCO 2, thereby increasing the oscillation frequency of the VCO 2. When the difference between the oscillation frequency of the VCO 2 and the target frequency Ftar is within the frequency difference range, the power module 12 may switch its output to a high-impedance state to maintain the operating voltage of the VCO 2 as unchanged. The above frequency difference range, as well as its upper limit value and lower limit value, can be configured or adjusted according to actual operating requirements.

In some embodiments, the adaptive adjustment circuit may implement the adaptive adjustment of the operating frequency and the operating voltage of the chip based on the following process. Specifically, the term "adaptive adjustment" may refer to the ability to perform automatic adjustment of the frequency and/or voltage based on self-detected conditions or changes. In other words, no external inputs or control are required to trigger the adaptive adjustment. Thus, the adaptive adjustment circuit may automatically perform self-adjustment of the frequency and/or voltage based on only Fclk and Ftar, without requiring any other signals or controls.

In some embodiments, the VCO 2 and the processor 3 may be located in the same chip. Preferably, the logic unit (e.g_, MOS transistor) in the VCO 2 and the logic unit (e.g., MOS transistor) in the processor 3 may have substantially the same threshold voltage, so they can be deemed having the same or similar manufacturing characteristics as the chip Specifically, the manufacturing processes of the processor 3 and the VCO 2, may be deemed the same. In real situations, the components in the same chip are most likely manufactured by the same manufacturer using the same or similar manufacturing process. Therefore, from the perspective of actual implementation, the quality characteristics of the processor 3 and the VCO 2 may be similar or identical, and may also be similar or the same as those of the chip.

In some embodiments, for two chips that may have differences in performance characteristics due to manufacturing process, in order to ensure that these two chips achieving substantially the same performance at the same target frequency, one of the two chips with lower quality may need to be configured with a higher operating voltage, in order to ensure its processor 3 having consistent performance as the one chip with higher quality. Further, the chip with lower quality may need to be configured with a higher working voltage for its VCO 2 to ensure that these two chips working at the same target frequency.

In some embodiments, due to the same manufacturing process, the variation trend of the working voltage for the processor 3, may be substantially the same as the variation trend of the working voltage for the VCO 2. In this case, the power module 12 can adaptively adjust its output voltage VDD (i.e., the operating voltage) to the VCO 2, so as to adjust the oscillation frequency of the VCO 2 to be the same as or similar to the target frequency. The result obtained by this adjustment is that the VDD corresponding to a lower quality chip is automatically adjusted to be higher, and the VDD corresponding to a higher quality chip is automatically adjusted to be lower. Therefore, the power module 12 in the adaptive adjustment circuit 1 can adaptively adjust its output voltage VDD according to the quality of the chip, thereby achieving the adaptive adjustment of the operating voltage of the VCO 2 according to the chip quality.

In some embodiments, as for the VCO 2, its oscillation frequency is determined by the working voltage, and the adjustment of its working voltage may inevitably lead to the adjustment of its oscillation frequency. Therefore, the adaptive adjustment circuit 1 can also allow the oscillation frequency of the VCO 2 (i.e., the operating frequency of the processor 3) to be adaptively adjusted based on the quality of the chip. Meanwhile, the working voltage of the VCO 2 is consistent with the working voltage of the processor 3, and therefore, the working voltage of the processor 3 may also be adaptively adjusted according to the quality of the chip.

In some embodiments, for a chip with high quality, assuming that at a certain target frequency F, if a "frequency-voltage" table is used to obtain its working voltage V1, the obtained working voltage V1 is often higher than an actually-needed voltage V2, which may result in unnecessary power consumption. Using the adaptive adjustment circuit 1, the operating voltage of the VCO 2 may be adjusted to be consistent with the operating voltage of the processor 3. Even if the processor 3 is initially configured with a voltage V1 which is higher than the actual required operating voltage V2, the voltage V1 may cause the difference between the oscillation frequency of the VCO 2 and the target frequency to be greater than the upper limit of the frequency difference range. In this case, the power module 12 may reduce its output voltage VDD until the difference between the oscillation frequency of the VCO 2 and the target frequency F is within the frequency difference range. When the difference between the oscillation frequency of the VCO 2 and the target frequency F is within the frequency difference range, the operating voltage of the processor 3 becomes lower than V1, and is the same or approximately the same as the V2. Therefore, the adaptive adjustment circuit 1 can adaptively adjust its operating frequency and operating voltage according to the quality of the chip, thereby reducing unnecessary power consumption in the circuit.

In some embodiments, the adaptive adjustment circuit 1 can perform the adaptive adjustment of the operating frequency of the chip along with its operating voltage.

Specifically, when the operating voltage of the chip increases and exceeds the actual demand of the chip, the oscillation frequency of the VCO 2 may also increase. In this case, in order to ensure that the difference between the oscillation frequency of the VCO 2 and the target frequency is within the frequency difference range, the power module 12 may reduce its output voltage VDD, thereby reducing the VCO 2 working voltage. Since the operating voltages of the VCO 2 and the processor 3 are substantially the same, the operating voltage of the processor 3 may also decrease. Therefore, when the working voltage of the chip increases and exceeds the actual demand of the chip, the adaptive adjustment circuit 1 can adaptively reduce the working voltage of the chip, so as to reduce the unnecessary power consumption while maintaining the performance of the chip.

In some embodiments, when the operating voltage of the chip decreases and it cannot meet the actual requirements of the chip, the adaptive adjustment circuit 1 can adaptively increase the operating voltage of the chip to meet the performance requirements of the chip.

Specifically, the adaptive adjustment circuit 1 can adaptively adjust the operating frequency and operating voltage of the chip according to the quality of the chip, so as to configure a higher operating voltage for the chip with lower quality to meet its performance requirements, and configure a lower operating voltage for the chip with higher quality, in order to reduce power consumption while meeting the chip's performance requirements. In addition, when the working voltage of the chip changes, the adaptive adjustment circuit can adaptively adjust the working frequency and the working voltage of the chip, so as to maintain the performance of the chip and reduce unnecessary power consumption as much as possible.

In some embodiments, the VCO 2 may be disposed/positioned adjacent to the processor 3 in the chip. In this case, the VCO 2 and the processor 3 may be subject to the same or similar working temperature. Specifically, modern chips tend to have very small dimensions, and as technology continues to develop, the dimensions of chips may become even smaller. Since the VCO 2 and the processor 3 are arranged adjacent to each other in the chip, the temperature difference between the two may be very small when the overall temperature of the chip changes, such that the VCO 2 and the processor 3 may be deemed having the same or similar temperature during operation, and the variation trend of the oscillation frequency of the VCO 2 due to temperature changes matches the variation trend of the frequency of the processor 3 due to the same temperature changes.

In some embodiments, the adaptive adjustment circuit 1 can perform adaptive adjustment of the operating frequency and the operating voltage of the chip when temperature changes during operation.

Specifically, when the temperature of the processor 3 changes and the performance of its internal logic units (e.g., MOS transistors) is degraded, the processor 3 may need a higher working voltage to maintain its performance. At the same time, since the VCO 2 and the processor 3 are operating in the same or similar temperatures, when the temperature of the processor 3 changes, the temperature of the VCO 2 will be under the same trend (for example, The temperature of the two increases or decreases at the same time), resulting in a decrease in the performance of its internal logic unit (such as a MOS transistor), which in turn causes its oscillation frequency to decrease and deviate from the target frequency.

In this case, the power module 12 may increase its output voltage VDD to ensure that the oscillation frequency of the VCO 2 is the same as or close to the target frequency. Thus, the adaptive adjustment circuit 1 can adaptively adjust the frequency according to the temperature changes, such that the working voltage and oscillating frequency of the VCO 2 are automatically adjusted in view of the changing temperature, thereby allowing the working voltage and working frequency of the processor 3 being adaptively adjusted according to the temperature changes.

In some cases, in order to ensure that the chip can work normally at all temperatures, the working voltage of the chip is often configured to a higher working voltage V3, and the working voltage V3 is used to ensure that the chip can still work normally under severe temperature conditions. However, chip temperature may change due to factors such as season, weather, working durations, etc. Even the same chip may be operating under different temperatures at different times. If the working voltage of the chip is fixedly configured as V3, when operating under a better temperature condition, the chip may be inevitably utilizing unnecessarily high power consumption.

In some embodiments, the adaptive adjustment circuit 1 can adaptively adjust the operating voltage and operating frequency of the chip according to the operating temperature. When the temperature condition is not ideal, a higher operating voltage is configured for the chip to ensure the performance of the chip. When the temperature condition is good, the chip may be configured with a lower operating voltage to reduce power consumption while maintaining chip performance. Therefore, the adaptive adjustment circuit 1 of the present disclosure can reduce the power consumption of the chip.

In some embodiments, the VCO 2 may be implemented using a ring oscillator. The ring oscillator may be formed by an odd number of NOT gates (or an odd number of cascaded inverters) with their respectively output terminals and input terminals connected end to end. The operating voltage of the ring oscillator may be set to be substantially the same as the operating voltage of the processor 3.

Preferably, the ring oscillator and the processor 3 are disposed adjacently in the chip, and the logic unit in the ring oscillator includes an N-channel MOSFET and a P-channel MOSFET. In this case, the oscillation frequency of the ring oscillator may be $$F = \frac{1}{2 \times (2 \times n + 1) \times T_d},$$

wherein the ring oscillator is composed of 2×n+1 inverters; and n is a positive integer. Further $$T_d = 3.5 \times VDD \times L^2 \times$$

$$\left( \frac{1}{\mu_n(T) \times W_n \times (VDD - V_{THN}(T))^2} + \frac{1}{\mu_p(T) \times W_p \times (VDD - V_{THP}(T))^2} \right) \times$$

$$(W_n + W_p)$$

wherein VDD is the output voltage value of the power module 12; L is the channel length of the MOSFET in the ring oscillator; $W_n$ is the channel width of the N-channel MOSFET in the ring oscillator; $W_p$ is the channel width of the P-channel MOSFET in the ring oscillator; $V_{THN}(T)$ is the initial turn-on voltage of the N-channel MOSFET in the ring oscillator when the temperature of the processor 3 is T Kelvins; $V_{THP}(T)$ is the initial turn-on voltage of the P-channel MOSFET in the ring oscillator when the temperature of the processor 3 is T Kelvins.

Taking an N-channel MOSFET as an example, its initial turn-on voltage is $$V_{THN}(T) \approx V_{THN}(T_0) \times \left(\frac{T - T_0}{0.6 \times V_{THN}(T_0)}\right),$$

wherein $V_{THN}(T_0)$ represents the initial turn-on voltage of the N-channel MOSFET at a reference temperature $T_0$; $\mu_n(T)$ is the carrier mobility of the N-channel MOSFET in the ring oscillator when the temperature of the processor 3 is T Kelvins; $\mu_p(T)$ is the carrier mobility of the P-channel MOSFET in the ring oscillator when the temperature of the processor 3 is T Kelvins. Taking an N-channel MOSFET as an example, its carrier mobility is $$\mu_n(T) = \mu_n(T_0) \times \left(\frac{T_0}{T}\right)^{1.5},$$

wherein $\mu_n(T_0)$ is the carrier mobility of the N-channel MOSFET at a reference temperature $T_0$.

It can be known from the above description, that the oscillation frequency of the ring oscillator may be a function of temperature, operating voltage, and chip technology (including MOSFET's channel length, channel width, etc.). The above description introduces the oscillation frequency for MOSFET-based ring oscillator. When the logic unit of the ring oscillator is implemented using other technologies, its oscillation frequency may still be a function of temperature, operating voltage, and chip technology. Likewise, when the ring oscillator is used as the clock source for the chip, the operating frequency of the chip may become a function of temperature, operating voltage, and chip technology.

In some embodiments, the adaptive adjustment circuit 1 further includes a pre-configuration module (not shown in FIG. 1). The pre-configuration module may be connected to the ring oscillator, and may be used to preconfigure the number of cascaded inverters in the ring oscillator, so that the oscillation frequency of the ring oscillator matches the frequency of the critical timing paths in the processor 3.

Figure 2:
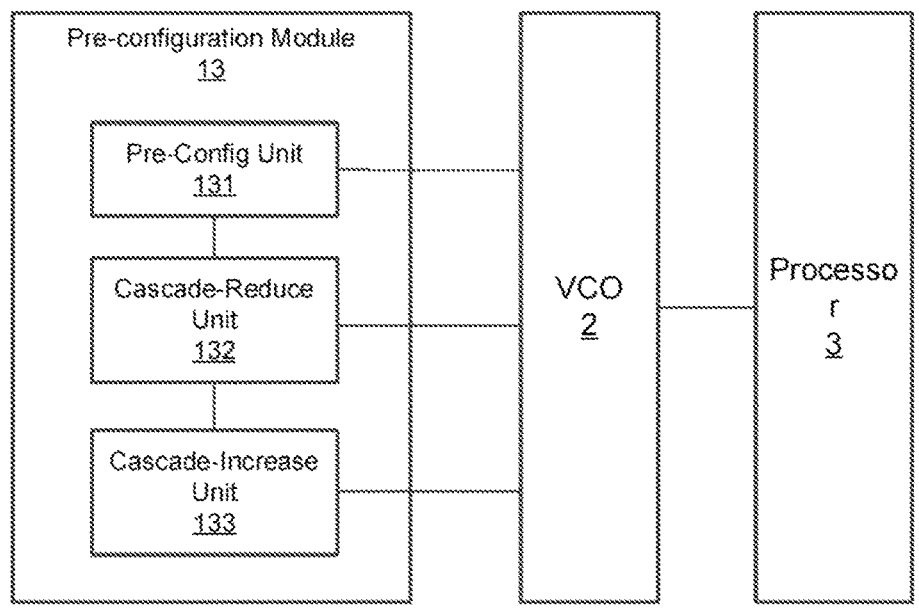
FIG. 2 illustrates a pre-configuration module operating with an adaptive adjustment circuit, according to one or more embodiments of the present disclosure.

FIG. 2 illustrates a pre-configuration module operating with an adaptive adjustment circuit, according to one or more embodiments of the present disclosure. In FIG. 2, the adaptive adjustment circuit may optionally be connected with a pre-configuration module 13. The pre-configuration module 13 includes a pre-configuration unit 131, a cascade-reduce unit 132, and a cascade-increase unit 133. The pre-configuration unit 131 is connected to the ring oscillator, and is used to configure a number of cascaded inverters to a preset number. The cascade-reduce unit 132 is connected to the ring oscillator, and is configured to, after the pre-configuration unit 131 successfully configured the number of cascaded inverters to the preset number, reduce the number of cascaded inverters until a timing violation occurs in the processor 3. The cascade-increase unit 133 is connected to the ring oscillator, and is configured to, after a timing violation occurs in the processor 3, increase the number of cascaded inverters by a marginal level.

In some embodiments, after the chip is powered on, the operating dock of the chip may be set to a default clock, and the ring oscillator is started. The pre-configuration unit 131 may preset the number of inverters in the ring oscillator to be large enough (e.g., 5), so that the oscillation frequency of the ring oscillator is low enough without causing timing violation in the processor 3. Afterward, the operating dock of the processor 3 is switched to the ring oscillator. Based on this, the cascade-reduce unit 132 may gradually reduce the number of cascaded inverters in the ring oscillator in order to increase the oscillation frequency of the ring oscillator, until the processor 3 encounters a timing violation under a stress test condition and results in a program or calculation error.

In this case, it can be deemed that the delay generated by the inverters in the ring oscillator is mostly consistent with the most critical timing path of the processor 3. On this basis, the cascade-increase unit 133 may increase the number of cascaded inverters in the ring oscillator by a marginal level, and treat it as the marginal level of the most critical timing path. The marginal level for the number of cascade stages may be a preset integer (e.g., 2). In this way, the pre-configuration module 13 can pre-configure the number of cascaded inverters in the ring oscillator, so that the oscillation frequency of the ring oscillator is related to the key critical timing path in the processor 3. As a result, the oscillation frequency of the ring oscillator can satisfy the timing requirement of the most critical timing path in the processor 3.

Preferably, the threshold voltage of the ring oscillator may be set to be consistent with the threshold voltage of the logic unit in the processor 3. In this case, although the oscillation frequency of the ring oscillator may change under different operating voltages, such oscillation frequency can always be matched with the frequency of the critical timing path in the processor 3, so as to realize the adaptive adjustment of the power supply voltage.

Figure 3:
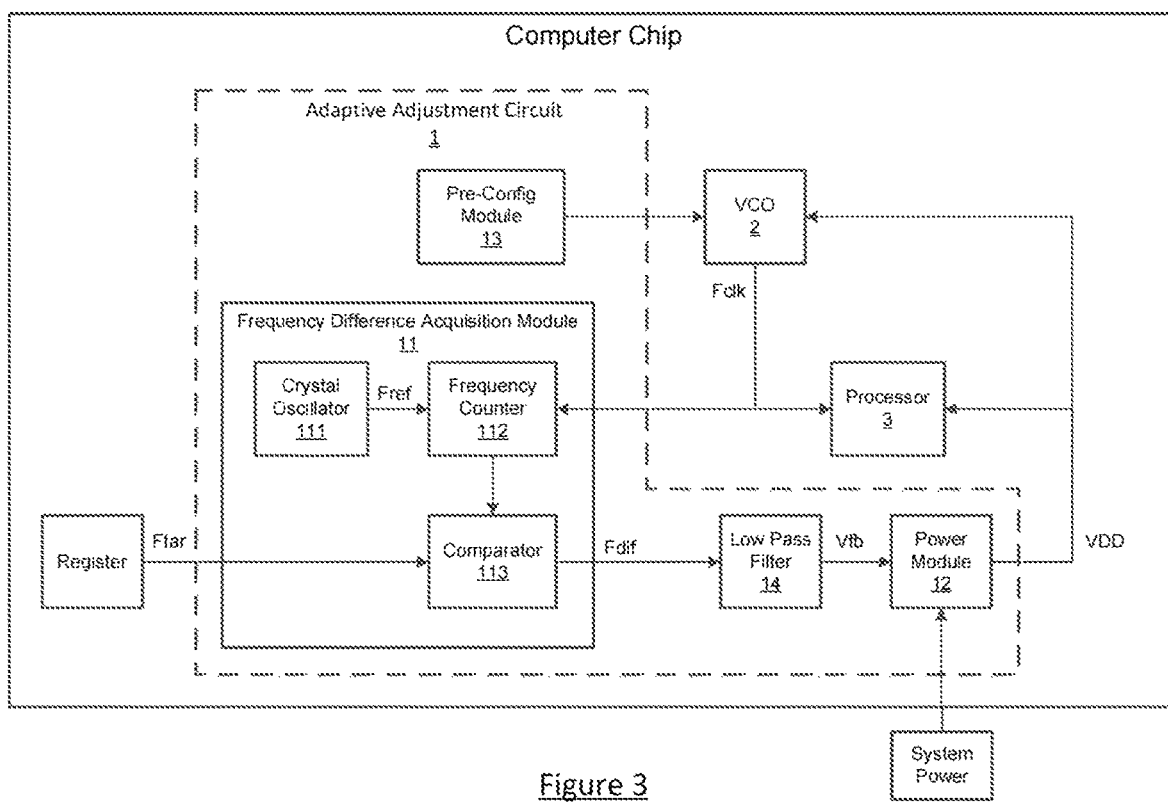
FIG. 3 illustrates a frequency difference obtaining module of an adaptive adjustment circuit, according to one or more embodiments of the present disclosure.

FIG. 3 illustrates a frequency difference obtaining module of an adaptive adjustment circuit, according to one or more embodiments of the present disclosure. In FIG. 3, the frequency difference obtaining module 11 may include, among other components, a crystal oscillator 111, a frequency counter 112, and a comparator 113.

In some embodiments, the crystal oscillator 111 may be configured to generate a high-precision reference dock signal Fref, and generate a specific precise time slot which may be used to detect the frequency of the VCO 2. The frequency of the reference dock signal Fref may be, e.g., 1 MHz.

In some embodiments, the frequency counter 112 may be connected to the crystal oscillator 111 and the VCO 2, and may be configured to obtain the oscillation frequency of the VCO 2. Specifically, the frequency counter 112 may count the number of clocks generated by the VCO 2 within a precise time slot (e.g., within 1 microsecond), and obtain the dock frequency of the VCO 2 through calculation. In addition, the frequency counter 112 can also output the value of the average frequency of the VCO 2 upon system inquiry.

In some embodiments, the comparator 113 may be connected to the frequency counter 112, and may be configured for comparing the oscillation frequency of the VCO 2 with a target frequency, in order to obtain a frequency difference signal. For example, the comparator 113 may be a numerical comparator. When the clock frequency generated by the VCO 2 is lower than the target frequency, the frequency difference signal outputted by the comparator 113 may be at a low level. Otherwise, the frequency difference signal outputted by the comparator 113 may be at a high level when the dock frequency generated by the VCO 2 is higher than the target frequency.

In some embodiments, the adaptive adjustment circuit 1 further includes a low-pass filter 14. The frequency difference obtaining module 11 is connected to the power module 12 through the low-pass filter 14. The low-pass filter 14 may be used to perform low-pass filtering on the frequency difference signal, so that the signal becomes a relatively smooth DC signal Vfb. In this case, the power module 12 may adjust its output voltage VDD according to the DC signal Vfb. For example, the power module 12 can be implemented by a DC/DC conversion circuit, and a portion of the DC signal Vfb may be added to the feedback circuit of the DC/DC conversion circuit, so as to achieve the adjusting of the output voltage of the DC/DC conversion circuit.

Figure 4:
FIG. 4 illustrates a computer chip implemented with an adaptive adjustment circuit, according to one or more embodiments of the present disclosure.

FIG. 4 illustrates a computer chip implemented with an adaptive adjustment circuit, according to one or more embodiments of the present disclosure. In FIG. 4, a chip may include, among other components, a processor, a VCO, and the adaptive adjustment circuit as shown in FIG. 1 or 3. Specifically, the VCO and the processor may be powered by the same power module in the adaptive adjustment circuit, and the VCO and the processor are preferably arranged adjacent to each other in the chip. The adaptive adjustment circuit may be connected to the VCO, and is configured for adjusting the working voltage of the voltage-controlled oscillator.

In some embodiments, the chip may include certain components of the adaptive adjustment circuit. For example, the chip may include the entire adaptive adjustment circuit, or may only include the frequency difference obtaining module 11 in the adaptive adjustment circuit. The chip may be packaged and marketed as an independent chip device with an adaptive adjustment circuit fabricated on a wafer using semiconductor technology; or as an independent package of the adaptive adjustment circuit using PCB packaging technology.

Based on the above description of the adaptive adjustment circuit and the chip, the present disclosure also provides an electronic device. The electronic device may be any device that includes the chip as shown in FIG. 4.

Based on the above description of the adaptive adjustment circuit, the present disclosure also provides methods to perform adaptive adjustment. The adaptive adjustment methods may be implemented by a chip including a processor and a VCO. The working voltage of the VCO and the processor are provided by the same power module, and the VCO and the processor are preferably disposed adjacent to each other in the chip. The adaptive adjustment methods can be used in the adaptive adjustment circuit shown in FIG. 1 or FIG. 3.

Figure 5:
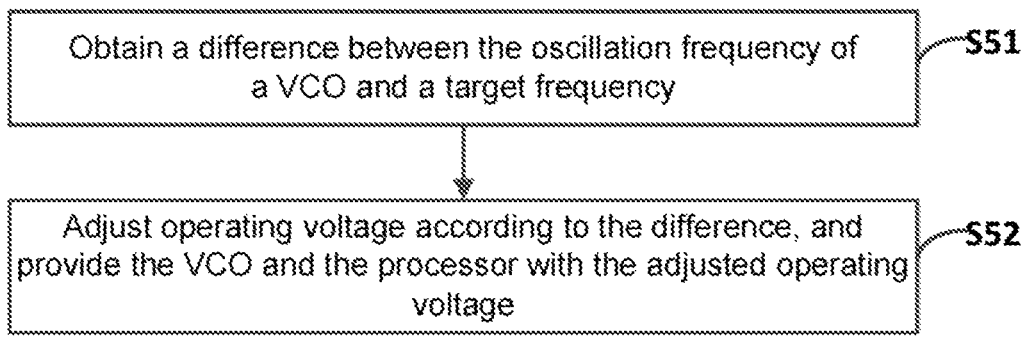
FIG. 5 shows a flow diagram illustrating one example process for adaptive frequency adjustment, according to one or more embodiments of the present disclosure.

FIG. 5 shows a flow diagram illustrating one example process for adaptive frequency adjustment, in accordance to certain embodiments of the present disclosure. The process sets forth various functional blocks, actions, or operations (as shown in e.g., S51 and S52) that may be described as processing operations, events, and/or acts, which may be performed by hardware, software, and/or firmware. For this and other processes and methods disclosed herein, the functions performed in the processes and methods may be implemented in differing order. Furthermore, the outlined actions and operations are only provided as examples, and some of the actions and operations may be optional, combined into fewer actions and operations, or expanded into additional actions and operations without detracting from the essence of the disclosed embodiments. Moreover, one or more of the outlined actions and operations may be performed in parallel.

As shown in FIG. 5, at operation S51: obtain a difference between an oscillation frequency of the VCO and a target frequency. This operation S51 may be implemented by the frequency difference obtaining module 11 shown in FIG. 1 or FIG. 3.

At operation S52 adjust an operating voltage according to the difference between the oscillation frequency of the VCO and the target frequency, and provide the VCO and the processor with the adjusted operating voltage. After adjustment, the difference between the new oscillation frequency of the VCO under the adjusted operating voltage and the target frequency is within a frequency difference range. This operation S52 may be implemented by the power module 12 shown in FIG. 1 or FIG. 3.

Based on the above description of the adaptive adjustment circuit, the present disclosure also provides a pre-configuration operation. The pre-configuration operation may be implemented in a chip, and the chip includes a processor and a ring oscillator.

Figure 6:
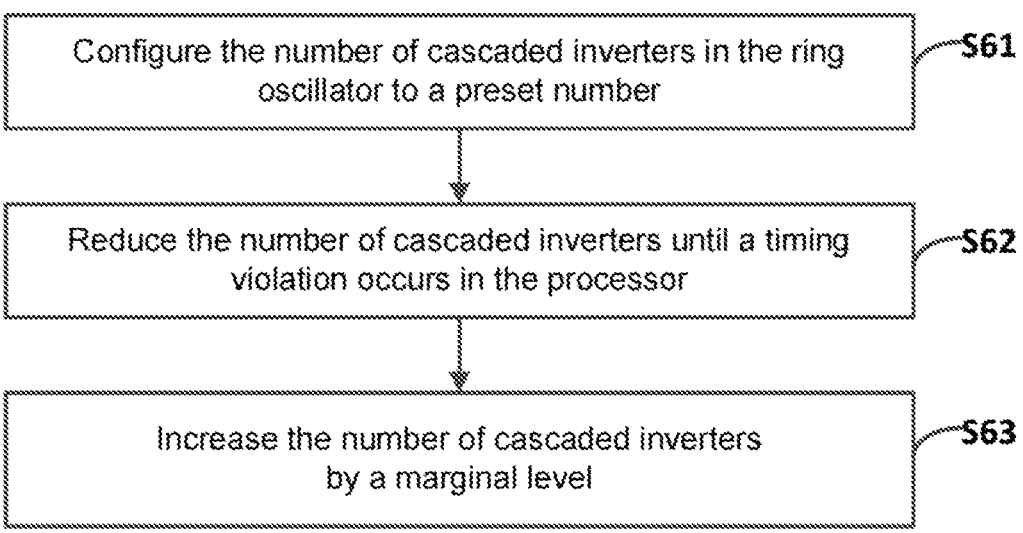
FIG. 6 shows a flow diagram illustrating one example process for pre-configuration during adaptive frequency adjustment, according to one or more embodiments of the present disclosure.

FIG. 6 shows a flow diagram illustrating one example process for pre-configuration during adaptive adjustment, in accordance to certain embodiments of the present disclosure. In some embodiments, the pre-configuration process can be implemented by the pre-configuration module 13 shown in FIG. 2 or FIG. 3.

At operation S61: configure the number of cascaded inverters in the ring oscillator to a preset number. Specifically, the preset number of cascaded inverters (or stages) needs to be large enough, in order to ensure the oscillation frequency of the ring oscillator to be low enough, and to ensure that no timing violation occurs in the processor.

At operation S62, reduce the number of cascaded inverters until a timing violation occurs in the processor. Specifically, when the number of cascaded inverters is reduced, the oscillation frequency of the ring oscillator is increased, and the operating frequency of the processor is also increased. Thus, operation S62 may gradually reduce the number of cascaded inverters, until the processor has a timing violation under the stress test condition, which leads to a program or calculation error. At this time, it can be determined that the delay generated by the inverters in the ring oscillator is substantially the same as the delay of the most critical timing path in the processor.

At operation S63: increase the number of cascaded inverters by a marginal level as the margin level of the most critical timing path in the processor. In some embodiments, the margin level may be a preset integer.

Through the above operations S61-S63, the pre-configuration process can perform the pre-configuration on the number of cascaded inverters in the ring oscillator, so that the oscillation frequency of the ring oscillator corresponds to the critical timing path in the processor. At this moment, the oscillation frequency of the ring oscillator can satisfy the timing requirement of the most critical timing path in the processor.

Based on above description, the adaptive adjustment circuit of the present disclosure can adaptively adjust the operating frequency and operating voltage of the chip according to the manufacturing quality of the chip, so as to configure a higher operating voltage for the chip with low quality to meet its performance requirements, and configure a lower operating voltage for chips with high quality, thereby reducing power consumption while meeting their performance requirements. In addition, when the working voltage of the chip changes, the adaptive adjustment circuit can adaptively adjust the working frequency and the working voltage of the chip, so as to maintain the performance of the chip and reduce unnecessary power consumption as much as possible. In addition, the self-adaptive frequency adjustment circuit of the present disclosure does not need a "frequency-voltage" table to obtain the operating voltage corresponding to each operating frequency of the chip, so there is no need to conduct a large number of stability tests, which is beneficial to reduce workload.

Furthermore, the adaptive adjustment circuit of the present disclosure can be implemented within a chip, and the chip includes a processor and a voltage-controlled oscillator. The voltage-controlled oscillator and the processor may be supplied with the same power supply, and the processor and the voltage-controlled oscillator can be placed adjacent to each other in the chip. Therefore, the voltage-controlled oscillator and the processor may be operating under identical, or small variant, conditions in terms of operating voltage, manufacturing process, and temperature differences.

When the operating voltage, manufacturing process, and temperature of the processor change, the power module in the adaptive adjustment circuit can adaptively adjust its output voltage, and the oscillation frequency of the voltage-controlled oscillator can be changed accordingly. The changed oscillation frequency can also meet the timing requirement of the most critical timing path in the processor, so that there is no timing violation and logic operation error in the processor. Therefore, the adaptive adjustment circuit of the present disclosure can achieve the adaptation to changes in operating frequency, manufacturing process, operating voltage and temperature for each chip. By using the adaptive adjustment circuit, the consistency and stability of the chip's performance can be improved.

In addition, the adjustment of the working voltage and oscillation frequency of the voltage-controlled oscillator by the adaptive adjustment circuit of the present disclosure is automatically realized by hardware, and no software is required in the process. The adjustment speed is quick and can achieve a single-clock level response time when changes that may require adjustment to the operating voltage and frequency occur—that is, the response time may be in nanosecond or even picosecond range.

To sum up, the present disclosure effectively overcomes various shortcomings in the prior art and has high industrial utilization value.

The various embodiments described herein may be practiced with other computer system configurations inducing hand-held devices, microprocessor systems, microprocessor-based or programmable consumer electronics, minicomputers, mainframe computers, and the like. Further, plural instances may be provided for components, operations, or structures described herein as a single instance. And boundaries between various components, operations, and data stores may be somewhat arbitrary, and particular operations are illustrated in the context of specific illustrative configurations. Other allocations of functionality are envisioned and may fall within the scope of the disclosure(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claims(s).

What is claimed is:

1. An adaptive adjustment circuit in a computer chip having a voltage-controlled oscillator (VCO) and a processor, the adaptive adjustment circuit comprises:
   a frequency difference acquisition module coupled with the VCO, wherein the frequency difference acquisition module is configured to generate a frequency difference signal based on a first difference between an oscillation frequency of the VCO and a target frequency; and
   a power module coupled to the frequency difference acquisition module, the VCO, and the processor, wherein the power module is configured to
       supply a working voltage to the VCO and the processor,
       adjust the working voltage based on the frequency difference signal, and
       supply the adjusted working voltage to the VCO and the processor, wherein a second difference between an adjusted oscillation frequency generated by the VCO under the adjusted working voltage and the target frequency is within a frequency difference range.

2. The adaptive adjustment circuit according to claim 1, wherein the VCO and the processor are disposed adjacently in the chip.

3. The adaptive adjustment circuit according to claim 1, wherein the VCO is a ring oscillator.

4. The adaptive adjustment circuit according to claim 3, further comprises:
   a pre-configuration module coupled with the ring oscillator, wherein a number of cascaded inverters in the ring oscillator is preconfigured to allow the ring oscillator's oscillation frequency matches critical timing paths in the processor.

5. The adaptive adjustment circuit according to claim 4, wherein the pre-configuration module comprises:
   a pre-configuration unit coupled with the ring oscillator, for configuring the number of cascaded inverters to a preset number;
   a cascade-reduce unit coupled with the ring oscillator and the pre-configuration unit, for reducing the number of cascaded inverters until a timing violation occurs in the processor, and
   a cascade-increase unit coupled with the ring oscillator and the cascade-reduce unit, for increasing the number of cascaded inverters by a margin level after the timing violation occurs in the processor.

6. The adaptive adjustment circuit according to claim 1, wherein the frequency difference acquisition module further comprises:
   a crystal oscillator for generating a reference clock signal;
   a frequency counter coupled with the crystal oscillator and the VCO, wherein the frequency counter is configured to obtain the oscillation frequency of the VCO; and
   a comparator coupled with the frequency counter, wherein the comparator is configured for comparing the oscillation frequency of the VCO with the target frequency to generate the frequency difference signal.

7. A computer chip, comprises:
   a processor;
   a voltage-controlled oscillator (VCO); and
   an adaptive adjustment circuit coupled with the VCO and the processor, wherein the adaptive adjustment circuit comprises:
       a frequency difference acquisition module coupled with the VCO, wherein the frequency difference acquisition module is configured to generate a frequency difference signal based on a first difference between an oscillation frequency of the VCO and a target frequency; and a power module coupled to the frequency difference acquisition module, the VCO, and the processor, wherein the power module is configured to
supply a working voltage to the VCO and the processor,
adjust the working voltage based on the frequency difference signal, and
supply the adjusted working voltage to the VCO and the processor, wherein a second difference between an adjusted oscillation frequency generated by the VCO under the adjusted working voltage and the target frequency is within a frequency difference range.

8. A method to perform adaptive adjustment in a computer chip having a voltage-controlled oscillator (VCO) and a processor, the method comprising:
supplying, by a power module, an operating voltage to the VCO and the processor;
generating, by a frequency difference acquisition module, a frequency difference signal based on a first difference between an oscillation frequency of the VCO and a target frequency;
adjusting, by the power module, the working voltage based on the frequency difference signal; and
supplying, by the power module, the adjusted working voltage to the VCO and the processor, wherein a second difference between an adjusted oscillation frequency generated by the VCO under the adjusted working voltage and the target frequency is within a frequency difference range.

9. The method as recited in claim 8, further comprising:
configuring, by a pre-configuration module, a number of cascaded inverters in the VCO to a preset number;
reducing, by the pre-configuration module, the number of cascades inverters until a timing violation occurs in the processor; and
increasing, by the pre-configuration module, the number of cascades of the inverters by a margin level.

* * * * *